(12) United States Patent
Giandalia et al.

(10) Patent No.: US 9,000,829 B2
(45) Date of Patent: Apr. 7, 2015

(54) SYSTEM ON CHIP FOR POWER INVERTER

(71) Applicant: International Rectifier Corporation, El Segundo, CA (US)

(72) Inventors: Marco Giandalia, Marina del Rey, CA (US); Toshio Takahashi, Rancho Palos Verdes, CA (US); Massimo Grasso, Trivolzio (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/794,124

(22) Filed: Mar. 11, 2013

(65) Prior Publication Data

US 2013/0271201 A1 Oct. 17, 2013

Related U.S. Application Data

(60) Provisional application No. 61/624,556, filed on Apr. 16, 2012.

(51) Int. Cl.
*H03K 17/56* (2006.01)
*H02M 7/537* (2006.01)
*H02M 7/5387* (2007.01)

(52) U.S. Cl.
CPC .......... *H02M 7/537* (2013.01); *H02M 7/53875* (2013.01)

(58) Field of Classification Search
None
See application file for complete search history.

(56) References Cited

U.S. PATENT DOCUMENTS

| | | | | |
|---|---|---|---|---|
| 5,883,490 | A | * | 3/1999 | Moreira ........................ 318/807 |
| 6,051,952 | A | * | 4/2000 | Moreira et al. ............... 318/738 |
| 7,352,143 | B2 | * | 4/2008 | Inaba et al. ................... 318/139 |
| 2002/0105769 | A1 | | 8/2002 | Sato |

FOREIGN PATENT DOCUMENTS

| | | |
|---|---|---|
| JP | 2001-327171 | 11/2001 |
| JP | 2009-283543 | 12/2009 |

* cited by examiner

*Primary Examiner* — Cassandra Cox
(74) *Attorney, Agent, or Firm* — Farjami & Farjami LLP

(57) ABSTRACT

According to an exemplary implementation, an integrated circuit (IC) includes a logic circuit monolithically formed on the IC. The logic circuit is configured to generate modulation signals for controlling power switches of a power inverter. The logic circuit generates the modulation signals based on at least one input value. The IC further includes a voltage level shifter monolithically formed on the IC. The voltage level shifter is configured to shift the modulation signals to a voltage level suitable for driving the power switches of the power inverter. The logic circuit can be a digital logic circuit and the input value can be a digital input value. The IC can also include a sense circuit monolithically formed on the IC. The sense circuit is configured to generate the input value.

20 Claims, 3 Drawing Sheets

SYSTEM ON CHIP FOR POWER INVERTER

The present application claims the benefit of and priority to a provisional patent application entitled "System on Chip for High Voltage Inverter Drive," Ser. No. 61/624,556 filed on Apr. 16, 2012. The disclosure in that provisional application is hereby incorporated fully by reference into the present application.

BACKGROUND

A power inverter is utilized to power a load such as a motor, a speaker, a lamp, or a switch mode power supply (SMPS). In order to power the load with appropriate modulation, the power inverter may be switched based on modulation signals generated by a logic circuit. The logic circuit may generate the modulation signals based on an input value, such as voltage, current, or impedance values of the power inverter. In order to drive the power inverter, the modulation signals may be shifted to a suitable voltage level for the power inverter by a voltage level shifter. The logic circuit and the voltage level shifter are in separate integrated circuits (ICs) and each of the separate ICs includes dedicated pins to accommodate each of the modulation signals.

SUMMARY

A system on chip for power inverter, substantially as shown in and/or described in connection with at least one of the figures, and as set forth more completely in the claims.

DETAILED DESCRIPTION

Figure 1:
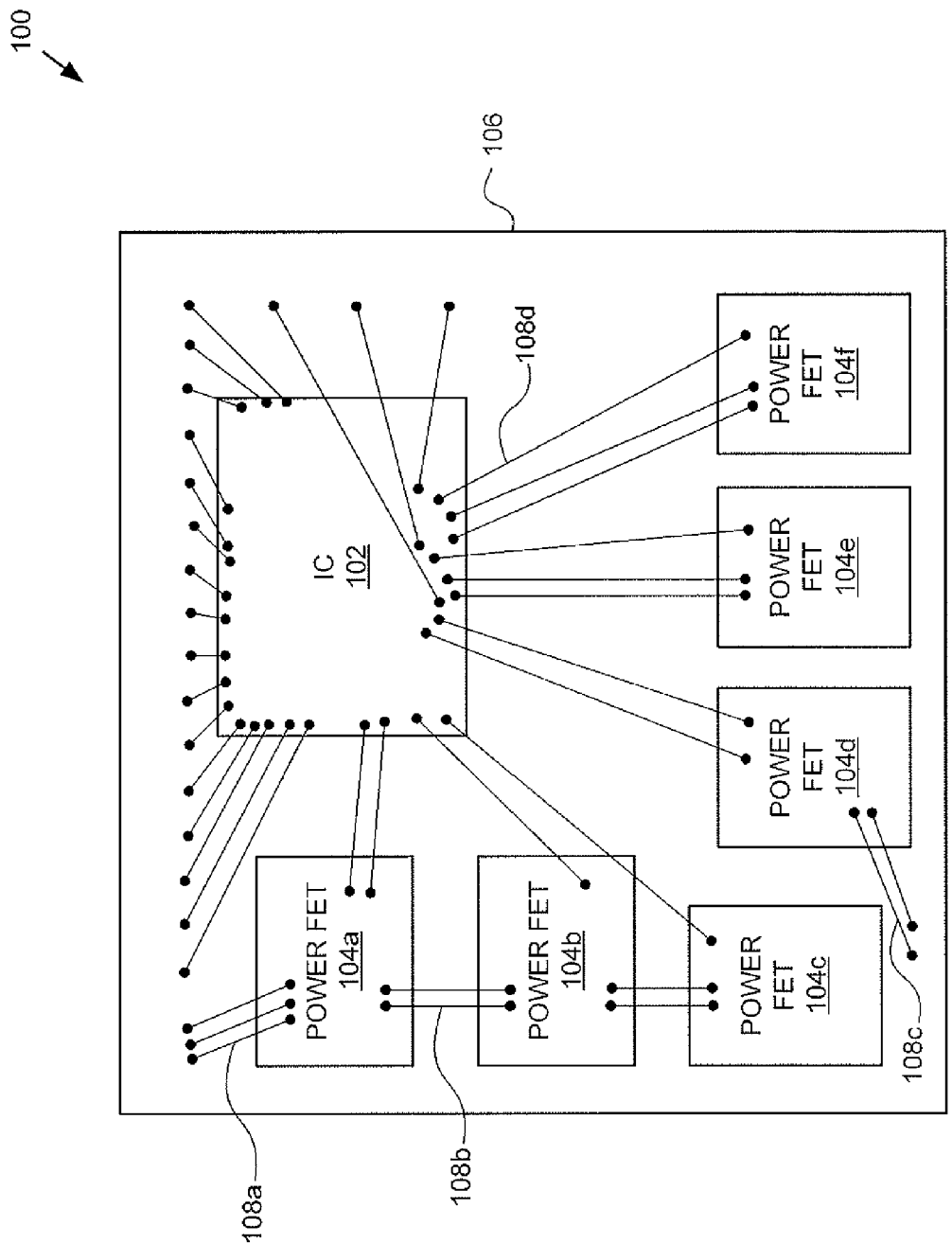
FIG. 1 shows a top view of an exemplary multi-chip module (MCM), in accordance with some implementations of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a top view of multi-chip module (MCM) 100. MCM 100 can be, for example, approximately 12 millimeters by approximately 12 millimeters in the dimensions shown, or of any other suitable dimensions. MCM 100 includes integrated circuit (IC) 102, power switches 104a, 104b, 104c, 104d, 104e, and 104f (also referred to collectively as "power switches 104"), leadframe 106, and bondwires 108. IC 102 can be, for example, a mixed-signal IC having both analog and digital circuits monolithically formed thereon. Power switches 104 can be, for example, power transistors, such as power field-effect transistors (FETs). In the implementation shown, IC 102 and power switches 104 are each situated on leadframe 106, which can be a copper leadframe. Also, IC 102 and power switches 104 are electrically coupled to one another utilizing a combination of leadframe 106 and bondwires. Of the bondwires, bondwires 108a, 108b, 108c, and 108d are individually labeled in FIG. 1. Certain details are omitted from FIG. 1 so as not to obscure aspects of the present disclosure. For example, leadframe 106 includes various portions, which are electrically insulated from one another. It is noted that in other implementations, IC 102 and power switches 104 can be electrically coupled to one another utilizing other means. Furthermore, IC 102 and power switches 104 may not necessarily be electrically coupled in an MCM or in the same MCM in every implementation of the present disclosure.

In the implementation shown in FIG. 1, MCM 100 is a system in package (SiP). IC 102 and power switches 104 are electrically coupled in a power inverter, and more particularly, a high voltage power inverter. The power inverter is a three-phase power inverter in the present implementation, but can be different types of power inverters. The three-phase power inverter includes three legs, each including a half-bridge formed from power switches 104. A first leg of the three-phase power inverter includes power switches 104c and 104d. A second leg of the three-phase power inverter includes power switches 104b and 104e. A third leg of the three-phase power inverter includes power switches 104a and 104f. While the implementation shown is a three-phase power inverter, in other implementations, MCM 100 can include a different number of phases than shown. For example, the power inverter can be a two-phase power inverter.

Figure 2:
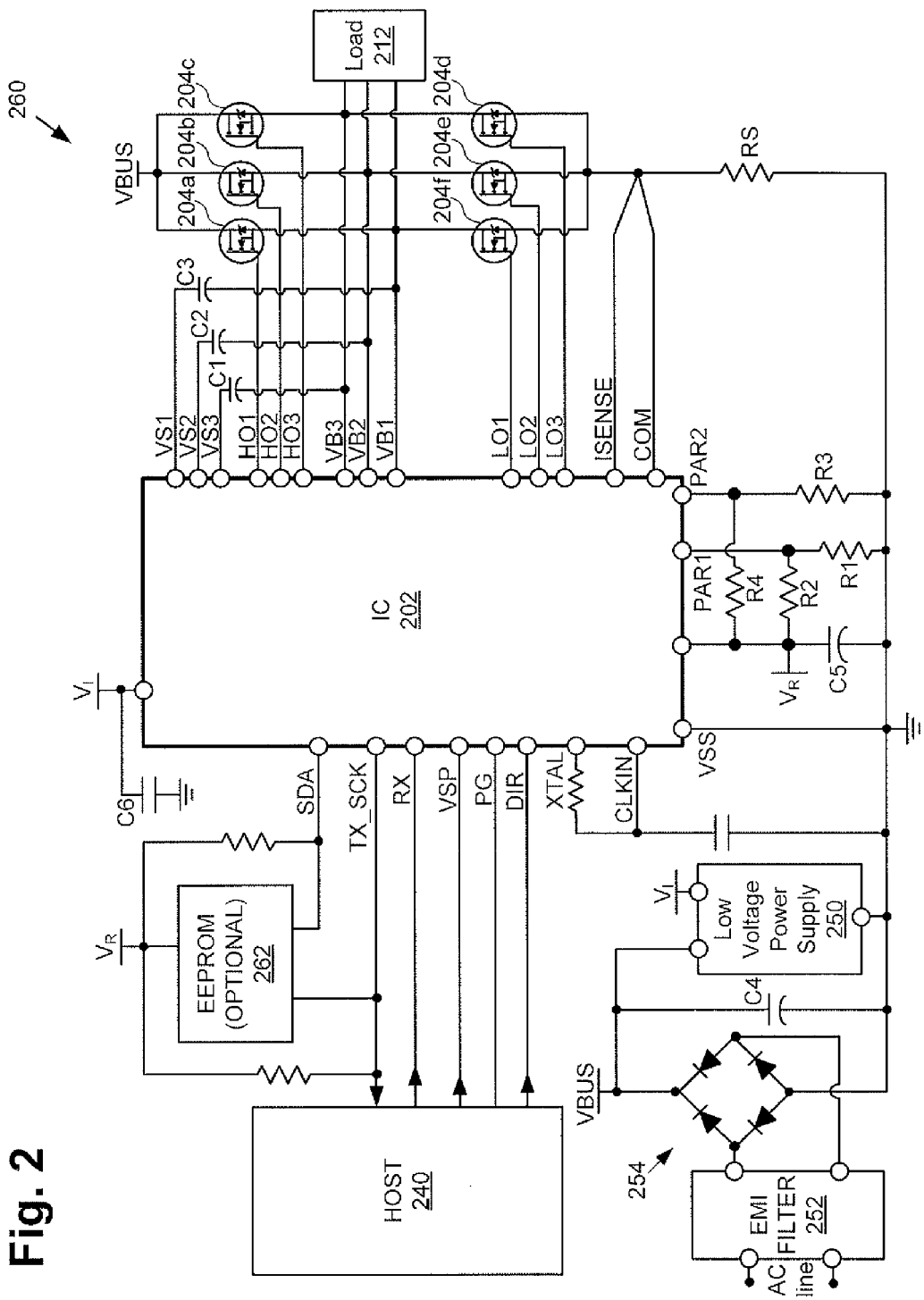
FIG. 2 shows an exemplary power inverter, in accordance with some implementations of the present disclosure.

Referring now to FIG. 2, FIG. 2 shows power inverter 260. In some implementations, MCM 100 in FIG. 1 is utilized to form power inverter 260 in FIG. 2. Power inverter 260 includes IC 202 corresponding to IC 102 in FIG. 100. Power inverter 260 also includes power switches 204a, 204b, 204c, 204d, 204e, and 204f (also referred to collectively as "power switches 204") corresponding respectively to power switches 104a, 104b, 104c, 104d, 104e, and 104f in FIG. 1. Power switches 204a, 204b, and 204c can be control switches and power switches 204d, 204e, and 204f can be sync switches.

IC 202 receives voltage input $V_I$ to drive power switches 204 so as to power load 212. As a specific example, voltage input $V_I$ can be approximately 15 volts. Voltage input $V_I$ may be provided from low voltage power supply 250, which can generate voltage input $V_I$ from an AC line utilizing capacitor C4, EMI filter 252, diode bridge 254, and bus voltage VBUS.

Non-limiting examples of load 212 include an electric motor, such as a fan motor, a speaker (where power inverter 260 can be a Class D amplifier), a lamp, and a switched-mode power supply. FIG. 2 shows IC 202 having three control switch drive outputs configured to provide respective high side drive signals HO1, HO2, and HO3 to gates of power switches 204a, 204b, and 204c. FIG. 2 also shows IC 202 having three sync switch drive outputs configured to provide respective low side drive signals LO1, LO2, and LO3 to gates of power switches 204d, 204e, and 204f.

Load 212 receives outputs between respective ones of power switches 204a and 204f, power switches 204b and 204e, and power switches 204c and 204d. Furthermore, IC 202 includes three bootstrap terminals connected to the outputs for respective bootstrap voltages VB1, VB2, and VB3. The three bootstrap terminals are coupled to respective ones of three supply terminals having respective supply voltages VS1, VS2, and VS3 through respective capacitors $C_1$, $C_2$, and $C_3$. Supply voltages VS are coupled to circuitry in IC 202 to generate high side drive signals HO1, HO2, and HO3 and low side drive signals LO1, LO2, and LO3. IC 202 can optionally include various additional features and can be coupled to at least one other device, such as host 240.

IC 202 is configured to utilize at least one logic operation and calculus to generate high side drive signals HO1, HO2, and HO3 and low side drive signals LO1, LO2, and LO3 such that power switches 204 are appropriately turned ON and OFF in sequence. High side drive signals HO1, HO2, and HO3 and low side drive signals LO1, LO2, and LO3 are level-up shifted voltages so as to provide appropriate voltage levels for the gate of power switches 204.

Figure 3:
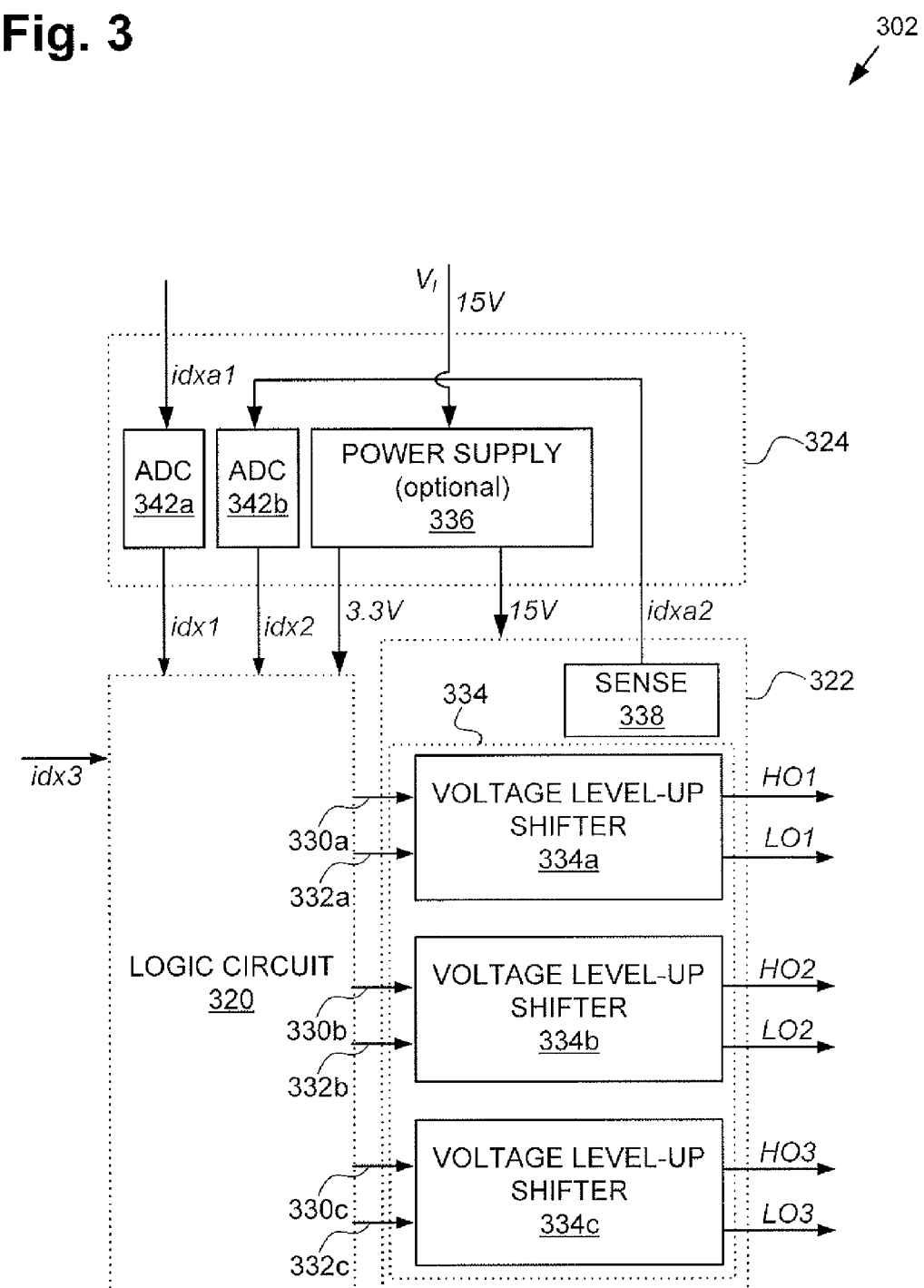
FIG. 3 shows a diagram of an exemplary integrated circuit (IC), in accordance with some implementations of the present disclosure.

Referring to FIG. 3, FIG. 3 shows a diagram of IC 302. IC 302 in FIG. 3 corresponds to IC 202 in FIG. 2. IC 302 includes logic circuit 320, voltage level-up section 322, and support circuit 324.

Voltage level-up section 322 includes sense circuit 338 and voltage level shifter 334, which includes voltage shifters 334a, 334b, and 334c. Support circuit 324 includes an optional power supply 336 and analog-to-digital converters (ADC) 342a and 342b.

Logic circuit 320 and voltage level shifter 334 are monolithically formed on IC 302. Logic circuit 320 is configured to generate high side modulation signals 330a, 330b, and 330c, and low side modulation signals 332a, 332b, and 332c for controlling power switches of a power inverter. The power switches can correspond to power switches 204 of power inverter 260 in FIG. 2. Low side modulation signals 332a, 332b, and 332c are also referred to herein as "modulation signals 332" and high side modulation signals 330 are also referred to herein as "modulation signals 330." Logic circuit 320 is configured to utilize at least one logic operation and calculus to generate modulation signals 330 and 332.

Voltage level shifter 334 is configured to shift modulation signals 330 and 332 to a voltage level suitable for driving the power switches of the power inverter. For example, voltages suitable for driving power switches 204 in FIG. 2. As shown in FIG. 3, voltage level shifter 334 is in voltage level-up section 322 and includes voltage level-up shifter 334a to level-up shift high side modulation signal 330a and low side modulation signal 332a to high side drive signal HO1 and low side drive signal LO1. Voltage level shifter 334 also includes voltage level-up shifter 334b to level-up shift high side modulation signal 330b and low side modulation signal 332b to high side drive signal HO2 and low side drive signal LO2. Voltage level shifter 334 further includes voltage level-up shifter 334c to level-up shift high side modulation signal 330c and low side modulation signal 332c to high side drive signal HO3 and low side drive signal LO3. Voltage level-up shifters 334a, 334b, and 334c can be collectively referred to as voltage level shifter 334. Voltage level shifter 334 can include more or less voltage level-up shifters than shown depending on application requirements (e.g. the number of half-bridges in power inverter 260).

Thus, high side drive signals HO1, HO2, and HO3 in FIG. 3 correspond to high side drive signals HO1, HO2, and HO3 in FIG. 2. Similarly, low side drive signals LO1, LO2, and LO3 in FIG. 3 correspond to low side drive signals LO1, LO2, and LO3 in FIG. 2. Suitable voltage levels for driving power switches 204 can be, for example, approximately 260 volts to approximately 600 volts, which is significantly higher than voltages in logic circuit 320. Thus, voltage level shifter 334 is in voltage level-up section 322, which is a higher voltage section of IC 302 than logic circuit 320.

In IC 302, logic circuit 320 and voltage level shifter 334 are each monolithically formed on IC 302. As such, IC 302 does not require dedicated pins to accommodate each of modulation signals 330 and 332. In doing so, power inverter 260 can avoid significant problems, such as those related to package layout, drive signal symmetry, and resistivity of connections. Thus, for example, IC 102 of FIG. 1 (corresponding to IC 302) can be provided in MCM 100 with power switches 104. Furthermore, as described above, MCM 100 can have small dimensions, such as 12 millimeters by approximately 12 millimeters.

The at least one logic operation and calculus utilized by logic circuit 320 to generate modulation signals 330 and 332 are based on at least one input value. Exemplary input values shown in FIG. 3 include input values idx1, idx2, and idx3. The at least one input value, such as input values idx1, idx2, and idx3 can include any combination of a digital input value and an analog input value. In the present implementation, input values idx1, idx2, and idx3 are digital input values and logic circuit 320 is a digital logic circuit (e.g. a digital core of a mixed signal IC).

Input value idx3 is an example of an input value received in digital form by IC 302 and provided to logic circuit 320. Input value idx1 is an example of an input value that IC 302 receives in analog form (as input value idxa1) and is provided in digital form to logic circuit 320. Input value idx2 is an example of an input value received in analog form (as an analog input value idxa2), for example, from a sense circuit within IC 302, such as sense circuit 338 in voltage level-up section 322, and provided in digital form to logic circuit 320.

In the implementation shown, support circuit 324 optionally includes an analog signal conditioner for interfacing with logic circuit 320 and having ADCs 342a and ADCs 342b configured to provide digital input values, such as input values idx1 and idx2 to logic circuit 320. As shown in FIG. 3, IC 302 optionally includes ADC 342a configured to convert input value idxa1 into input value idx1. Also, IC 302 optionally includes ADC 342b configured to convert analog input value idxa2 into digital input value idx2. It is noted that in some implementations, any of input values idx1, idx2, and idx3 can be provided to logic circuit 320 in analog form, for example, where logic circuit 320 accepts analog inputs. Thus, for example, input values idxa1 and idxa2 may be provided to logic circuit 320 without ADCs 342a and 342b in some implementations.

Thus, input values idx1 and idx3 (and/or other input values not specifically shown) are provided from an external source to IC 302. As examples, input values idx1 and idx3 can be received from host 240 in FIG. 2. In one implementation, input values idx1 or idx3 can be a speed set point voltage VSP in FIG. 2, which is a desired speed of load 212, where load 212 is a motor. Input values idx1 or idx3 can also correspond to a direction control input DIR from host 240, which is a desired direction from load 212, where load 212 is a motor. In some implementations, input values idx1 and/or idx3 are provided via a universal asynchronous receiver/transmitter (UART) interface from host 240. For example, input values idx1 and/or idx3 can be provided to IC 202 over receive signal RX. Furthermore, input values idx1 and/or idx3 may be provided from electrically erasable programmable read-only memory (EEPROM) 262 through SDA input.

Input values idx1 and/or idx3 can be from other sources besides an external device, such as host 240. For example, input values idx1 and/or idx3 can correspond to PAR1 and PAR2 in FIG. 2. Logic circuit 320 may utilize PAR1 and PAR2 to adjust algorithms for generating modulation signals 330 and 332 so as to accommodate different types of loads for load 212 (e.g. different types of motors). As shown in FIG. 2 PAR1 and PAR2 can be provided utilizing capacitor C5, resistors R1, R2, R3, and R4, and voltage $V_R$. Voltage $V_R$ can be approximately 3.3 volts, as one example.

Input values idx1 and/or idx3 can also be from external sensors and/or other external sources not specifically shown in FIG. 2. In one implementation, input value idxa1 includes sensed current ISENSE of power switches 204 in FIG. 2. For example, IC 302 can be coupled to a source terminal of any combination of power switches 204 though a shunt resistor, such as shunt resistor $R_S$. Sensed current ISENSE can be utilized by IC 302 to provide power management to power inverter 260, such as Energy Star compliant power management. As another example, any of input values idx1 and idx3 can be from a Hall effect sensor, which can be included in load 212.

As input values idx1 and idx3 are from an external source of IC 302, input values idx1 and idx3 are accommodated in power inverter 260, which can reduce performance of power inverter 260 and complicate design. For example, IC 302 may require one or more input pins to receive input values idx1 and idx3, thereby consuming valuable real estate on IC 302. Furthermore, power inverter 260 may require routing in MCM 100 of FIG. 1 to provide input values idx1 and idx3 to the input pins of IC 302. The routing can be long and complex thereby increasing parasitics and complicating design. Thus, it may be desirable to reduce or eliminate use of external input values, such as input values idx1 and idx3.

In accordance with some implementations of the present disclosure, input value idx2 (and/or other input values not specifically shown) is an internal signal of mixed signal IC 302. Thus, use of external input values, such as input values idxa1 and idx3 can be reduced or eliminated. Input value idx2 can be, for example, a sensed value (e.g. of power switches 204) from sense circuit 338. It is noted that sense circuit 338 is located in voltage level-up section 322, but can be located elsewhere on IC 302. However, it may be desirable to receive input value idx2 (and/or other input values not specifically shown) from voltage level-up section 322 (e.g. a high-voltage section) of IC 302.

Input values idx1, idx2, and idx3 can be, for example, any combination of a voltage value, a current value, an impedance value, a temperature value, a magnetic index, and or other indexes or values of power switches 204 of power inverter 260 in FIG. 2. Thus, it will be appreciated that sense circuit 338 can be configured to sense at least one of those values. As sense circuit 338 is monolithically formed on IC 302 and is configured to generate input value idx2, IC 302 can avoid or reduce issues associated with external input values, such as those described above with respect to input values idx1 and idx3.

In some implementations, IC 302 includes power supply 336 monolithically formed on IC 302. Power supply 336 is configured to power logic circuit 320 and voltage level shifter 334. As such, amongst other advantages, IC 302 only requires a single pin for input voltage $V_I$.

Thus, as described above with respect to FIGS. 1, 2, and 3, a logic circuit and a voltage level shifter can be monolithically formed on an IC. Furthermore, a power supply and/or sense circuit may also be monolithically formed on the IC. In various implementations, the IC can advantageously avoid or reduce problems associated with accommodating external signals. As such, the IC can be included in a single package, such as a single frame based package (e.g. MCM 100) with associated power switches.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An integrated circuit (IC) comprising:
   a logic circuit monolithically formed on said IC, said logic circuit configured to generate modulation signals for controlling power switches of a power inverter, said logic circuit generating said modulation signals based on at least one input value;
   a voltage level shifter monolithically formed on said IC, said voltage level shifter configured to shift said modulation signals to a voltage level suitable for driving said power switches of said power inverter;
   wherein said IC is a mixed-signal IC having analog and digital circuits monolithically formed thereon.

2. The IC of claim 1, wherein said logic circuit comprises a digital logic circuit.

3. The IC of claim 1, wherein said input value comprises a digital input value.

4. The IC of claim 1 comprising a sense circuit monolithically formed on said IC, said sense circuit configured to generate said input value.

5. The IC of claim 1, wherein said input value comprises a sensed value of said power switches of said power inverter.

6. The IC of claim 1 comprising a power supply monolithically formed on said IC, said power supply configured to power said logic circuit and said voltage level shifter.

7. The IC of claim 1, wherein said power inverter is a three-phase power inverter.

8. The IC of claim 1, wherein said IC is configured to receive said input value in analog form.

9. The IC of claim 1, wherein said IC comprises an analog-to-digital converter configured to provide said input value to said logic circuit.

10. The IC of claim 1, wherein said input value comprises at least one of a voltage, a current, an impedance, and a temperature value of said power switches of said power inverter.

11. The IC of claim 1, wherein said IC is in a multi-chip-module with said power switches of said power inverter.

12. An integrated circuit (IC) comprising:
    a digital logic circuit monolithically formed on said IC, said digital logic circuit configured to generate modulation signals for controlling power switches of a power inverter, said digital logic circuit generating said modulated signals based on at least one digital input value;
    a voltage level shifter monolithically formed on said IC, said voltage level shifter configured to shift said modulation signals to a voltage level suitable for driving said power switches of said power inverter;
    wherein said IC is a mixed-signal IC having analog and digital circuits monolithically formed thereon.

13. The IC of claim 12 comprising a sense circuit monolithically formed on said IC, said sense circuit configured to generate said digital input value.

14. The IC of claim 12 comprising a power supply monolithically formed on said IC, said power supply configured to power said digital logic circuit and said voltage level shifter.

15. The IC of claim 12, wherein said digital input value comprises a sensed value of said power switches of said power inverter.

16. The IC of claim 12, wherein said power inverter is a three-phase power inverter.

17. The IC of claim 12, wherein said IC is configured to receive said digital input value in analog form.

18. The IC of claim 12, wherein said IC comprises an analog-to-digital converter configured to provide said digital input value to said digital logic circuit.

19. The IC of claim 12, wherein said digital input value comprises at least one of a voltage, a current, an impedance, and a temperature value of said power switches of said power inverter.

20. The IC of claim 12, wherein said IC is in a multi-chip-module with said power switches of said power inverter.

* * * * *